United States Patent
Huang et al.

(10) Patent No.: US 9,991,363 B1
(45) Date of Patent: Jun. 5, 2018

(54) CONTACT ETCH STOP LAYER WITH SACRIFICIAL POLYSILICON LAYER

(71) Applicant: GLOBALFOUNDRIES INC., Grand Cayman (KY)

(72) Inventors: Haigou Huang, Rexford, NY (US); Jinsheng Gao, Clifton Park, NY (US); Haifeng Sheng, Rexford, NJ (US); Jinping Liu, Ballston Lake, NY (US); Huy Cao, Rexford, NY (US); Hui Zang, Guiderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/657,594

(22) Filed: Jul. 24, 2017

(51) Int. Cl.
*H01L 21/336* (2006.01)
*H01L 29/66* (2006.01)
*H01L 21/02* (2006.01)
*H01L 21/8234* (2006.01)
*H01L 21/321* (2006.01)

(52) U.S. Cl.
CPC .... *H01L 29/66545* (2013.01); *H01L 21/0217* (2013.01); *H01L 21/0223* (2013.01); *H01L 21/0228* (2013.01); *H01L 21/02164* (2013.01); *H01L 21/02236* (2013.01); *H01L 21/02323* (2013.01); *H01L 21/02532* (2013.01); *H01L 21/02595* (2013.01); *H01L 21/32105* (2013.01); *H01L 21/823418* (2013.01); *H01L 21/823431* (2013.01); *H01L 21/823437* (2013.01)

(58) Field of Classification Search
CPC .......... H01L 21/01264; H01L 21/0217; H01L 21/0223; H01L 21/02323; H01L 29/66545; H01L 21/32105
USPC .......................................................... 438/283
See application file for complete search history.

(56) References Cited

U.S. PATENT DOCUMENTS

| | | | |
|---|---|---|---|
| 6,346,468 B1 | 2/2002 | Pradeep et al. | |
| 6,881,616 B1* | 4/2005 | Hellig | H01L 21/31116 257/E21.252 |
| 7,405,116 B2 | 7/2008 | Carter et al. | |
| 7,456,062 B1* | 11/2008 | En | H01L 29/6656 257/E21.148 |
| 2004/0157397 A1* | 8/2004 | Quek | H01L 29/6653 438/305 |
| 2016/0149038 A1* | 5/2016 | Loubet | H01L 29/06 438/218 |
| 2017/0317180 A1* | 11/2017 | Chuang | H01L 29/785 |

* cited by examiner

*Primary Examiner* — David S Blum
(74) *Attorney, Agent, or Firm* — Scully Scott Murphy and Presser; Frank Digiglio

(57) ABSTRACT

A contact etch stop layer includes a nitride layer formed over a sacrificial gate structure and a polysilicon layer formed over the nitride layer. During subsequent processing, the polysilicon layer is adapted to oxidize and form an oxide layer. The oxidation of the polysilicon layer effectively shields the underlying nitride contact etch stop layer from oxidation, which protects the mechanical integrity of the nitride layer.

19 Claims, 4 Drawing Sheets

US 9,991,363 B1

CONTACT ETCH STOP LAYER WITH SACRIFICIAL POLYSILICON LAYER

BACKGROUND

The present application relates generally to semiconductor devices, and more specifically to transistors such as field effect transistors and their methods of production.

The fabrication of semiconductor devices such as field effect transistors (FETs) typically involves multiple steps of layer deposition, patterning, and etching to define various structures on a substrate. Integration schemes using spacer and cap layers, for instance, may be used to precisely define respective conductive and insulating structures and accordingly minimize leakage between neighboring conductive structures to improve device performance.

In certain approaches, a contact etch stop layer (CESL) may be incorporated into the fabrication scheme to enable the selective removal of one or more layers. The unavailability of sufficiently etch-selective processes, however, and the attendant potential for damage to the contact etch stop layer may result in damage to protected layers, which may adversely affect manufacturing throughput and yield.

SUMMARY

In view of the foregoing, disclosed is a method for forming a semiconductor structure that incorporates an improved contact etch stop layer. The contact etch stop layer includes a sacrificial layer of polysilicon. During processing that may oxidize and damage the contact etch stop layer as well as layers underlying the contact etch stop layer, the polysilicon layer may itself oxidize and inhibit oxidation of these layers.

In accordance with embodiments of the present application, a method of fabricating a device includes forming a sacrificial gate structure over a semiconductor substrate, wherein the sacrificial gate structure includes a sacrificial gate and a sacrificial gate gap formed over the sacrificial gate, forming a sidewall spacer layer over sidewalls of the sacrificial gate structure, and forming a nitride contact etch stop layer over the sidewall spacer layer. A polysilicon layer is then formed over upper portions of the nitride layer, and an oxide layer is formed over the polysilicon layer, where during formation of the oxide layer the polysilicon layer is oxidized.

According to a further method, a plurality of sacrificial gate structures, each including a sacrificial gate and a sacrificial gate gap formed over the sacrificial gate, are formed over a semiconductor substrate. A sidewall spacer layer is formed over sidewalls of the sacrificial gate structures, and a nitride contact etch stop layer is formed over the sidewall spacer layer.

The method further includes forming a flowable oxide layer within gaps between adjacent sacrificial gate structures and over lower portions of the nitride layer, forming a polysilicon layer over upper portions of the nitride layer, and forming a high density plasma oxide layer over the polysilicon layer, such that the polysilicon layer is oxidized during formation of the HDP oxide layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
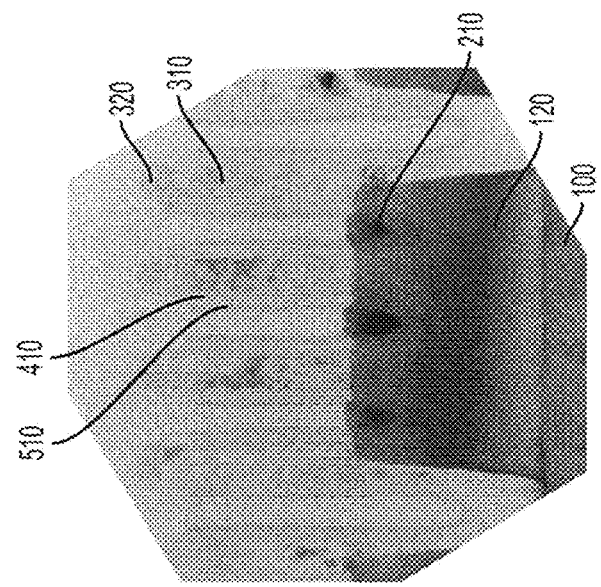
FIG. 1 is transmission electron microscope (TEM) micrograph of a semiconductor structure including a conformal nitride contact etch stop layer disposed over adjacent sacrificial gate structures after filling gaps between the adjacent sacrificial gate structures with a flowable dielectric material and recessing the dielectric material.

Reference will now be made in greater detail to various embodiments of the subject matter of the present application, some embodiments of which are illustrated in the accompanying drawings. The same reference numerals will be used throughout the drawings to refer to the same or similar parts.

Disclosed in various embodiments is a method of manufacturing a semiconductor device such as a fin field effect transistor (FinFET) device having an improved contact etch stop layer. The disclosed method may be implemented in conjunction with a gate last, or replacement metal gate (RMG) process. A typical process flow for manufacturing replacement metal gate (RMG) transistors includes forming a temporary or sacrificial gate, forming additional transistor structures, and then removing the sacrificial gate leaving a trench where various layers of material (e.g., gate dielectric and gate conductor materials) are deposited to form the functional gate. This approach delays gate formation until after processing that may otherwise damage the gate materials, such as exposure to elevated temperatures and/or ion implantation. As used herein, a "functional gate" refers to a structure used to control output current (i.e., the flow of carriers through a channel) of a semiconductor device using an electrical field or, in some instances, a magnetic field, and includes a gate dielectric and a gate conductor.

According to various embodiments, the method includes forming a sacrificial polysilicon layer over a nitride contact etch stop layer (CESL). The polysilicon layer is adapted to oxidize preferentially to the underlying nitride layer and sidewall spacer layer during subsequent processing. Thus, the nitride contact etch stop layer and sidewall spacer layer may effectively protect various device features during one or more processing steps. In particular, the CESL is adapted to confine etching to particular regions (e.g., between adjacent gate structures) during a contact etch process. The CESL should have good etch resistance to the chemistry that is later used to etch the region where a contact is to be formed.

In various embodiments, the polysilicon layer is formed directly over the nitride contact etch stop layer, i.e., over upper portions of the nitride contact etch stop layer (CESL), laterally adjacent to the sacrificial gate stack following a recess etch of a flowable oxide from within locations between adjacent sacrificial gate structures. Applicant has found that during subsequent processing, oxidation of the polysilicon layer proceeds selectively with respect to oxidation of the nitride CESL layer, which protects the integrity of the nitride CESL layer and inhibits undesired erosion of the sacrificial gate.

Referring to FIG. 1, a transmission electron microscope (TEM) micrograph shows a device architecture including a plurality of sacrificial gate structures 300 disposed over a shallow trench isolation layer 140. The cross-sectional view of FIG. 1 is taken between active device regions, i.e., along a non-contacted cross-section between adjacent parallel semiconductor fins.

The sacrificial gate structures 300 each include a sacrificial gate 310 and a sacrificial gate cap 320 formed over the sacrificial gate 310. Sacrificial gate 310 may include amorphous or polycrystalline silicon, and sacrificial gate cap 320 may include a nitride layer such as silicon nitride, as known to those skilled in the art.

Sidewalls spacers 410 are disposed over sidewalls (vertical surfaces) of the sacrificial gate structures 300. Sidewall spacers 410 may be formed by blanket deposition of a spacer material followed by a directional etch such as reactive ion etching (RIE) to remove the spacer material from horizontal surfaces. Suitable sidewall materials include oxides, nitrides and oxynitrides, such as silicon dioxide, silicon nitride, silicon oxynitride, and low dielectric constant (low-k) materials such as amorphous carbon, SiOC, SiOCN and SiOCN, as well as a low-k dielectric material. As used herein, a low-k material has a dielectric constant less than that of silicon dioxide. In certain embodiments, the sidewall spacer 410 thickness is 4 to 20 nm, e.g., 4, 10, 15 or 20 nm, including ranges between any of the foregoing values.

A conformal nitride contact etch stop layer 510 is disposed over the sidewall spacers 410 between adjacent sacrificial gate structures 300. In certain embodiments, the thickness of the nitride contact etch stop layer 510 may range from 2 to 6 nm, e.g., 2, 4, or 6 nm, including ranges between any of the foregoing values. The nitride contact etch stop layer 510 may be formed by atomic layer deposition (ALD), for example.

As described herein, the formation or deposition of a layer or structure may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), metal organic CVD (MOCVD), atomic layer deposition (ALD), molecular beam epitaxy (MBE), electroplating, electroless plating, ion beam deposition, and physical vapor deposition (PVD) techniques such as sputtering or evaporation.

In various embodiments, the sidewall spacers 410 and the nitride CESL layer 510 are formed from materials that can be etched selectively to one another. In particular embodiments, the sidewall spacers 410 comprises SiOCN and the nitride contact etch stop layer 510 comprises silicon nitride.

Furthermore, as will be appreciated, the compounds silicon nitride and silicon dioxide have compositions that are nominally represented as $Si_3N_4$ and $SiO_2$, respectively. The terms silicon nitride and silicon dioxide, refer to not only these stoichiometric compositions, but also to nitride and oxide compositions that deviate from the stoichiometric compositions.

In an example process, as illustrated in part in FIG. 1, a layer of flowable oxide 610 is deposited directly over the nitride contact etch stop layer 510 to fill the gaps between the sacrificial gate structures 300. In various embodiments, a flowable material at least partially fills the gaps and is then converted into a silicon dioxide film. Such a process may be used to fill high aspect ratio gaps, including gaps having aspect ratios ranging from 3:1 to 10:1.

In various methods, a flowable silicon dioxide is deposited using one or more silicon-containing precursors and an oxidizing gas. Example silicon precursor materials include, but are not limited to, alkoxysilanes, e.g., tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), dimethoxysilane (DMOS), triphenylethoxysilane, 1-(triethoxysilyl)-2-(diethoxymethylsilyl)ethane, tri-t-butoxylsilanol. Example oxidizing gases include, but are not limited to, ozone, hydrogen peroxide, oxygen, water (steam), and alcohols, such as methanol, ethanol, and isopropanol.

During and/or subsequent to deposition of the flowable material, a portion or all of the deposited layer 610 may be densified using, for example, a cure/anneal process. According to various embodiments, a cure/anneal process involves exposure to a steam, thermal, ultraviolet (UV), electron-beam (e-beam), microwave, laser or plasma source in an oxidative or inert environment.

Notwithstanding a densification anneal of the flowable oxide, it may be advantageous to replace the flowable oxide 610 with a higher quality, denser oxide proximate to the top of the filled gaps, i.e., laterally adjacent to the top of the sacrificial gate structure 300, in order to improve the etch resistance of the exposed oxide material filling the gaps during subsequent processing.

Figure 2:
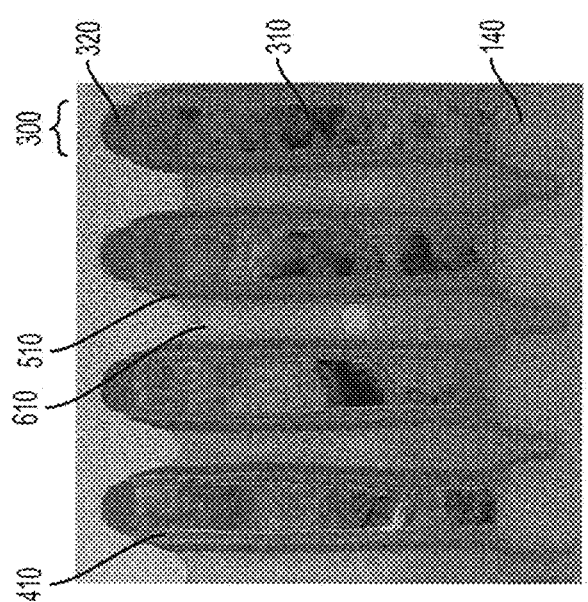
FIG. 2 is transmission electron microscope (TEM) micrograph showing portions of the structure of FIG. 1 including the breakdown of the nitride contact etch stop layer and underlying sidewall spacer layer following the high density plasma deposition of an oxide layer into the recessed regions between adjacent sacrificial gate structures.

Referring still to FIG. 1, a recess etch of the flowable oxide layer 610 reopens a portion of the gap at the top of the structure and exposes upper portions of the nitride contact etch stop layer 510. Referring to FIG. 2, a high density plasma (HDP) oxide 620 may be formed within the recessed regions, capping the flowable oxide layer 610. HDP oxide is typically deposited by high density plasma chemical vapor deposition (HDP-CVD) under oxidizing conditions from a suitable silicon-containing precursor.

Although effective at producing a high density oxide, the process conditions used to form the high density plasma (HDP) oxide layer 620 over the recessed flowable oxide layer 610 may etch exposed portions of the nitride CESL 510, as shown in FIG. 2. It has been observed that the oxidizing conditions associated with deposition of the high density plasma oxide layer 620 may adversely affect nitride layer 510 and/or sidewall spacer 410, resulting in a breakdown in the etch resistance of these layers. In the illustrated structure, the HDP oxide deposition has removed portions of the nitride CESL 510 as well as the underlying sidewall spacer 410 laterally adjacent to top portions of the sacrificial gate 310.

In processes where breakdown of the nitride layer 510 and sidewall spacer 410 result in exposure of upper portions of the sacrificial gate 310, associated damage to the sacrificial gate 310 may result in an electrical short between adjacent contacts, e.g., between a later-formed source/drain contact within the inter-gate gap and a gate contact overlying a gate.

As will be appreciated, the cross-sectional view of FIG. 2 is taken along active device regions, i.e., along a contacted cross-section through a semiconductor fin 120, and shows plural sacrificial gate structures 300 overlying the fin 120, i.e., over channel regions of the fin between source/drain junctions 210.

In various embodiments, a semiconductor device may comprise a fin field effect transistor (FinFET). In such embodiments, one or more semiconductor fins 120 may be formed by patterning and etching the semiconductor layer of a composite substrate such as an SOI substrate or a top portion of a bulk semiconductor substrate 100.

For instance, semiconductor substrate 100 may comprise a semiconductor material such as silicon (Si) or a silicon-containing material. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof.

The semiconductor substrate 100 is not limited to silicon-containing materials, however, as the substrate 100 may comprise other semiconductor materials, including Ge and compound semiconductors such as GaAs, InAs and other like semiconductors. Portions of the semiconductor substrate 100 may be amorphous, polycrystalline, or single crystalline.

The etching process used to form fins 120 typically comprises an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

By way of example, the fins 120 may be formed using a sidewall image transfer (SIT) process, which includes formation of a spacer material on sidewall surfaces of a mandrel. The spacer includes a material that has a different etch selectivity than the mandrel such that, after spacer formation, the mandrel is removed by etching. Each spacer is then used as a hard mask during a subsequent etching process that defines the fins.

The semiconductor fins 120 are typically arranged in parallel and are laterally isolated from each other by the shallow trench isolation layer 140. Raised source/drain junctions 210 are disposed over portions of the fins 120 (i.e., source and drain regions) proximate to top surfaces thereof. As known to those skilled in the art, source/drain junctions 210 may be formed by ion implantation or selective epitaxy, optionally using the sacrificial gate structures 300 as an alignment mask. For instance, according to various embodiments, source/drain junctions 210 are formed by selective epitaxy into self-aligned cavities that are defined over the fins between the sacrificial gate structures. That is, source/drain junctions 210 are formed over source and drain regions of the fins 120 on either side of a channel region, which underlies the sacrificial gate structure 300.

Source/drain junctions 210 may comprise silicon (e.g., Si) or a silicon-containing material such as silicon germanium (SiGe). For instance, SiGe source/drain junctions may be incorporated into a p-MOS device to provide compressive stress to the channel, which can improve carrier mobility.

As seen with reference still to FIG. 2, within the source/drain contact locations, i.e., within contacted regions, the nitride contact etch stop layer 510 is formed over the sidewall spacers 410 as well as over the source/drain junctions 210.

Figure 3:
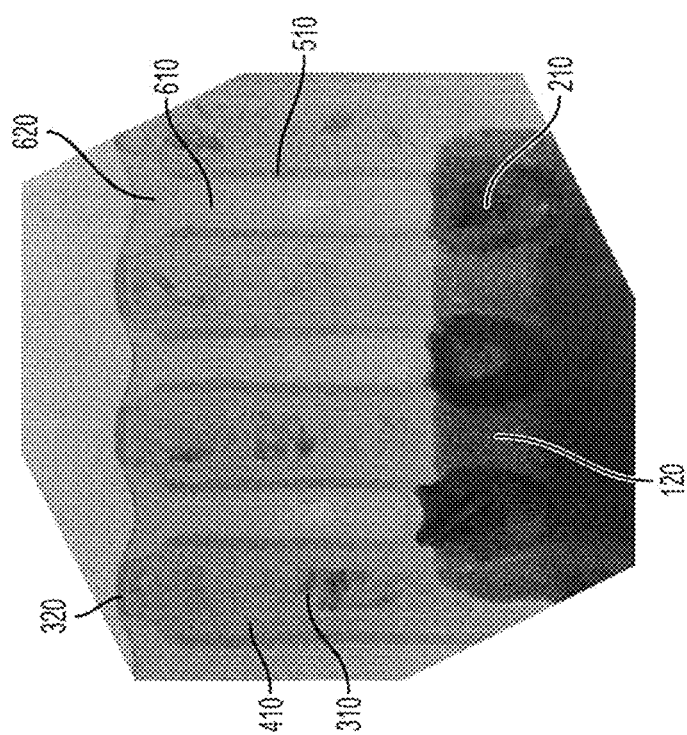
FIG. 3 is transmission electron microscope (TEM) micrograph of a semiconductor structure according to various embodiments showing retention of the nitride contact etch stop layer and underlying sidewall spacer layer adjacent to the sacrificial gate structure following the formation of a sacrificial polysilicon layer and the high density plasma deposition of an oxide layer into recessed regions and over the polysilicon layer between adjacent sacrificial gate structures.

Referring to FIG. 3, and in accordance with various embodiments, dual dielectric layers 610, 620 are formed between adjacent sacrificial gate structures 300 and over source/drain junctions 210. The dielectric layers, including a flowable oxide layer 610 and an overlying high density plasma oxide layer 620, may be formed without adversely etching nitride CESL 510 by forming a sacrificial polysilicon layer directly over the nitride contact etch stop layer 510 after recessing the flowable oxide layer 610 and prior to depositing the high density plasma oxide layer 620.

A method of forming an improved CESL architecture is described with reference to FIGS. 4-8. Described herein is a composite CESL layer where a sacrificial polysilicon layer 520 is formed over the nitride contact etch stop layer 510 prior to formation of a high density plasma oxide layer 620. During deposition of the high density plasma oxide layer 620, the polysilicon layer 520 is oxidized in situ to form an additional oxide layer 530.

According to various embodiments, a method of fabricating a device such as a FinFET device includes forming a sacrificial gate structure 300 over a semiconductor substrate, wherein the sacrificial gate structure 300 includes a sacrificial gate 310 and a sacrificial gate gap 320 formed over the sacrificial gate 310. A sidewall spacer layer 410 is formed over sidewalls of the sacrificial gate structure 300. A nitride (CESL) layer 510 is then formed over the sidewall spacer layer 410. The method further includes forming a polysilicon layer 520 over upper portions of the nitride layer 510, and forming an oxide layer, e.g., a HDP oxide layer 620, over the polysilicon layer 520. During formation of the oxide layer 620, the polysilicon layer 520 is completely oxidized.

Figure 4:
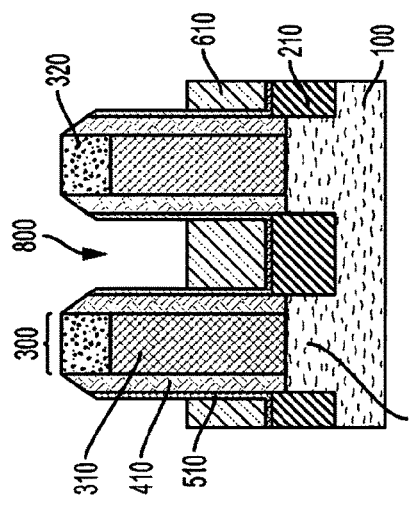
FIG. 4 is a cross-sectional schematic view of a device architecture showing deposition of a nitride contact etch stop layer over adjacent sacrificial gate structures and the subsequent deposition of a flowable oxide layer into gaps between the gate structures according to various embodiments.

Referring to FIG. 4, a cross-sectional schematic view shows the deposition of a conformal nitride contact etch stop layer 510 over a sacrificial gate structure 300. As illustrated, the nitride layer 510 is formed directly over source/drain junctions 210 between adjacent sacrificial gate structures 300 and directly over sidewalls spacers 410. An ALD process may be used to form nitride layer 510. A flowable oxide layer 610 is formed between adjacent sacrificial gate structures 300 and over the nitride layer 510.

Figure 5:
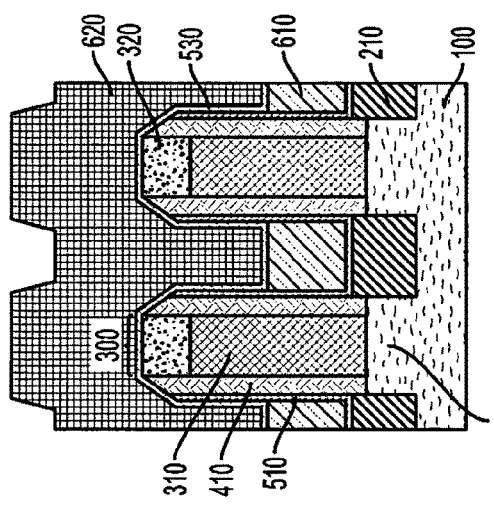
FIG. 5 is a cross-sectional schematic view of the device architecture of FIG. 4 following a recess etch of the flowable oxide layer.

Referring to FIG. 5, a cross-sectional schematic view shows the structure of FIG. 4 following a recess etch of the flowable oxide layer 610 to open a gap 800 between adjacent sacrificial gate structures 300. Following the recess etch of the flowable oxide layer 610, portions of the nitride layer 510 are exposed. In various embodiments, the recess etch of the flowable oxide layer 610 exposes the nitride layer over upper portions of the sacrificial gate structure 300, such that upper portions of the nitride layer 510 are exposed within the gap 800, while remaining portions of the flowable oxide layer 610 are disposed over lower portions of the nitride layer 510.

Figure 6:
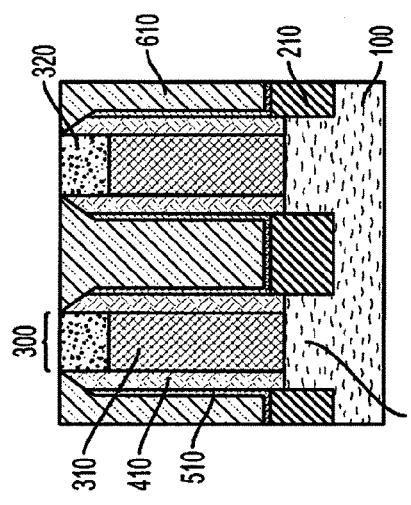
FIG. 6 shows deposition of a conformal polysilicon layer over the recessed flowable oxide layer and over the sacrificial gate structures including directly over upper portions of the nitride contact etch stop layer.
Figure 7:
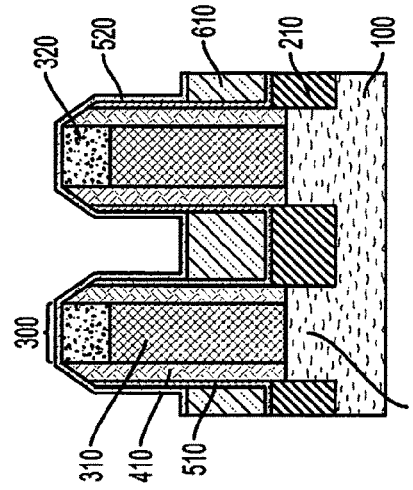
FIG. 7 shows deposition of a high density plasma oxide directly over the polysilicon layer and into upper portions of the gaps between adjacent sacrificial gate structures as well as the attendant oxidation of the polysilicon layer.

Referring to FIG. 6, a conformal polysilicon layer 520 is formed within gaps 800 and over the sacrificial gate structure 300. In the illustrated embodiment, the polysilicon layer 520 is formed directly over upper portions of the nitride layer 510, as well as directly over a top surface of the sacrificial gate cap 320.

A polysilicon (polycrystalline silicon) layer 520 may be deposited using low pressure chemical vapor deposition (LPCVD) techniques. For example, LPCVD polysilicon layers may be deposited by pyrolytic decomposition of silane gas at low pressure, although other reaction methods are available.

Following a recess etch of the flowable oxide layer 610 and deposition of the sacrificial polysilicon layer 520, a high density plasma oxide layer 620 is formed within gaps 800 and over the sacrificial gate structure 300. The high density plasma oxide layer 620 is formed directly over the sacrificial polysilicon layer 520. Accompanying the deposition of high density plasma oxide layer 620 is the oxidation of polysilicon layer 520 to form an additional oxide layer 530. Oxide layer 530 is formed in situ over upper portions of sacrificial gate cap 320 as well as over upper portions of nitride contact etch stop layer 510. In certain embodiments, the polysilicon layer 520 is completely oxidized during deposition of the HDP oxide layer 620 to form the oxide layer 530 such that no polysilicon material remains.

Figure 8:
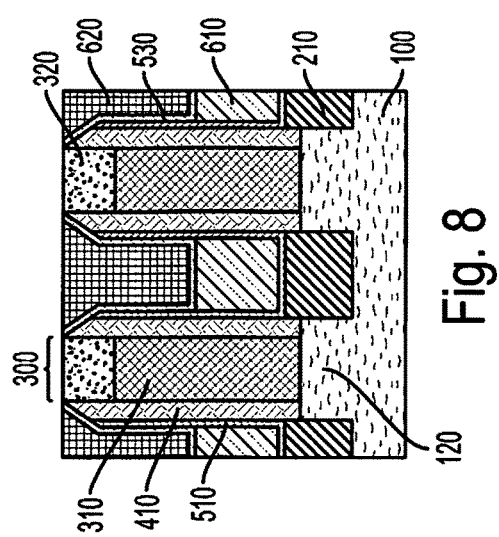
FIG. 8 shows planarization of the high density plasma oxide.

Referring to FIG. 8, following deposition of the high density plasma oxide 620, the structure may be planarized. "Planarization" is a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface. The sacrificial gate cap 320 may function as a CMP etch stop for a planarization process. In the illustrated embodiment, a top surface of the oxide layer 620 is coplanar with a top surface of the sacrificial gate cap 320.

Referring again to FIG. 3, by protecting the nitride CESL 510 and sidewall spacer 410 from oxidation, unwanted etching or erosion of the polysilicon gate 310 during downstream processing can be avoided.

The disclosed method provides a composite contact etch stop layer (CESL) architecture. Devices fabricated using the contact etch stop layer architecture have a decreased propensity for sacrificial gate erosion and fewer incidences of inter-contact electrical short circuits. Integrated circuits fabricated using the instant method have improved reliability and performance, with minimal leakage between gate and source/drain contacts, and decreased instances of circuit failure.

As used herein, the singular forms "a," "an" and "the" include plural referents unless the context clearly dictates otherwise. Thus, for example, reference to a "sacrificial gate structure" includes examples having two or more such "sacrificial gate structures" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a contact etch stop layer that comprises silicon nitride include embodiments where a contact etch stop layer consists essentially of silicon nitride and embodiments where a contact etch stop layer consists of silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of fabricating a device, comprising:
   forming a sacrificial gate structure over a semiconductor substrate, wherein the sacrificial gate structure includes a sacrificial gate and a sacrificial gate gap formed over the sacrificial gate;
   forming a sidewall spacer layer over sidewalls of the sacrificial gate structure;
   forming a nitride layer over the sidewall spacer layer;
   forming a polysilicon layer over upper portions of the nitride layer; and
   forming an oxide layer over the polysilicon layer, wherein the polysilicon layer is oxidized during formation of the oxide layer.

2. The method of claim 1, wherein the nitride layer is formed by atomic layer deposition.

3. The method of claim 1, wherein the nitride layer comprises silicon nitride.

4. The method of claim 1, wherein the polysilicon layer is formed directly over the upper portions of the nitride layer.

5. The method of claim 1, wherein the polysilicon layer is completely oxidized during formation of the oxide layer.

6. The method of claim 1, wherein the polysilicon layer is formed directly over a top surface of the sacrificial gate cap.

7. The method of claim 1, further comprising forming a flowable oxide layer over lower portions of the nitride layer prior to forming the polysilicon layer.

8. The method of claim 7, wherein the polysilicon layer is formed over a top surface of the flowable oxide layer and directly over the upper portions of the nitride layer laterally adjacent to the sacrificial gate.

9. The method of claim 1, wherein the oxide layer comprises a high density oxide.

10. The method of claim 1, wherein forming the sacrificial gate structure comprises forming a plurality of sacrificial gate structures over the semiconductor substrate.

11. The method of claim 10, further comprising forming a source/drain junction over the semiconductor substrate between adjacent sacrificial gate structures of the plurality of sacrificial gate structures.

12. The method of claim 11, wherein the nitride layer is formed directly over the source/drain junction.

13. A method of fabricating a device, comprising:
   forming a plurality of sacrificial gate structures over a semiconductor substrate, wherein the sacrificial gate structures each include a sacrificial gate and a sacrificial gate gap formed over the sacrificial gate;
   forming a sidewall spacer layer over sidewalls of the sacrificial gate structures;
   forming a nitride layer over the sidewall spacer layer;
   forming a flowable oxide layer between adjacent sacrificial gate structures and over lower portions of the nitride layer;
   forming a polysilicon layer over upper portions of the nitride layer; and
   forming an oxide layer over the polysilicon layer, wherein the polysilicon layer is oxidized during formation of the oxide layer.

14. The method of claim 13, further comprising recessing the flowable oxide layer between the adjacent sacrificial gate structures prior to forming the polysilicon layer.

15. The method of claim 13, wherein the polysilicon layer is completely oxidized during formation of the oxide layer.

16. The method of claim 13, wherein the oxide layer comprises a high density oxide.

17. The method of claim 13, further comprising forming a source/drain junction over the semiconductor substrate between the adjacent sacrificial gate structures.

18. The method of claim 17, wherein the nitride layer is formed directly over the source/drain junction.

19. The method of claim 13, further comprising forming a plurality of fins from the semiconductor substrate and forming the plurality of sacrificial gate structures over the plurality of fins.

* * * * *